(12) United States Patent
Kim

(10) Patent No.: US 6,531,250 B2
(45) Date of Patent: Mar. 11, 2003

(54) HALF-TONE PHASE SHIFT MASK HAVING A STEPPED APERTURE

(75) Inventor: Hyoung-joon Kim, Seoul (KR)

(73) Assignee: Samsung Eletronics Co., Ltd., Suwon (KR)

(*) Notice: Subject to any disclaimer, the term of this patent is extended or adjusted under 35 U.S.C. 154(b) by 108 days.

(21) Appl. No.: 09/759,161

(22) Filed: Jan. 16, 2001

(65) Prior Publication Data

US 2001/0009745 A1 Jul. 26, 2001

(30) Foreign Application Priority Data

Jan. 18, 2000 (KR) .............................. 00-2229

(51) Int. Cl.[7] .............................. G03F 9/00; G03C 5/00
(52) U.S. Cl. ............................................ 430/5; 430/394
(58) Field of Search .......................... 430/5, 322, 323, 430/324, 394

(56) References Cited

U.S. PATENT DOCUMENTS 5,281,500 A  *  1/1994  Cathey et al. ............... 430/5
5,487,962 A  *  1/1996  Rolfson ........................ 430/5
6,106,979 A  *  8/2000  Pierrat ......................... 430/5

FOREIGN PATENT DOCUMENTS

KR  1997-0049088  7/1997
KR  1998-0003806  3/1998

* cited by examiner

Primary Examiner—S. Rosasco
(74) Attorney, Agent, or Firm—Volentine Francos PLLC

(57) ABSTRACT

A half-tone phase shift mask includes a transparent substrate, a phase shift pattern formed on the semiconductor substrate and having a stepped aperture which exposes the transparent substrate by a predetermined width, and an opaque film pattern formed on the upper surface of the phase shift pattern. The stepped aperture is defined by an interior side wall of the phase shift pattern. This side wall includes a horizontal surface which is parallel to the surface defining the bottom of the aperture. Light transmitted by the mask via the surface defining the bottom of the aperture has a phase difference of 180 degrees with respect to light transmitted by the mask via the horizontal surface, and light transmitted by the mask via the surface defining the bottom of the aperture has a phase difference of more than 180 degrees with respect to light transmitted by the mask via the upper surface of the phase shift pattern. Accordingly, the half-tone phase shift mask includes a first transmissive region for blocking light, a second transmissive region that sets the width of a pattern to be formed on photosensitive film, a third transmissive region for causing light transmitted thereby to be out of phase by 180 degrees with respect to the light transmitted by the second transmissive region, and a fourth transmissive region having a width greater than the width of the third transmissive region for causing light transmitted thereby to be out of phase by more than 180 degrees with respect to light transmitted by the second transmissive region.

12 Claims, 10 Drawing Sheets

HALF-TONE PHASE SHIFT MASK HAVING A STEPPED APERTURE

BACKGROUND OF THE INVENTION

1. Field of the Invention

The present invention relates to masks which are used to manufacture semiconductor integrated circuits. More particularly, the present invention relates to a half-tone phase shift mask (HT PSM).

2. Description of the Related Art

Semiconductor integrated circuits are made up of predetermined patterns (e.g., a conductive layer pattern, a contact layer pattern, etc.) disposed on a semiconductor substrate. These predetermined patterns are formed from a photosensitive film that is first provided on the surface of the semiconductor substrate. The film is then exposed to light through a mask or a reticle (hereinafter, referred to as a mask) bearing a pattern to be transferred to the photosensitive film. Recently, the design rule of the layers of the integrated circuit has decreased to meet the demand for more highly integrated semiconductor devices. Accordingly, the mask patterns, which are transferred to the photosensitive film during an exposure process, have become hyperfine. However, this trend toward hyperfine mask patterns has given rise to a problem associated with the characteristic of the diffraction of light during the exposure process.

Hence, half-tone phase shift masks (HT PSMs) have received much attention as of late as a means for solving the problems caused by the diffraction of light through a mask bearing a hyperfine pattern. However, the use of an HT PSM in the exposure process cannot completely solve the problems caused by the diffraction of light.

Such problems generated when a photosensitive film pattern is formed using a conventional HT PSM will now be described in detail with reference to FIGS. 1A and 1B. The graph of FIG. 1B is a representation of the diffraction pattern created by a conventional HT PSM, wherein the distance from a reference point on a flat wafer surface is plotted along the horizontal (X) axis, and the intensity of normalized light is plotted along the vertical axis. Furthermore, although the problem created by the use of the conventional HT PSM will be described with respect to the forming of a pattern on a positive photosensitive film, such a problem also applies to forming patterns on negative photosensitive films.

Figure 1A:
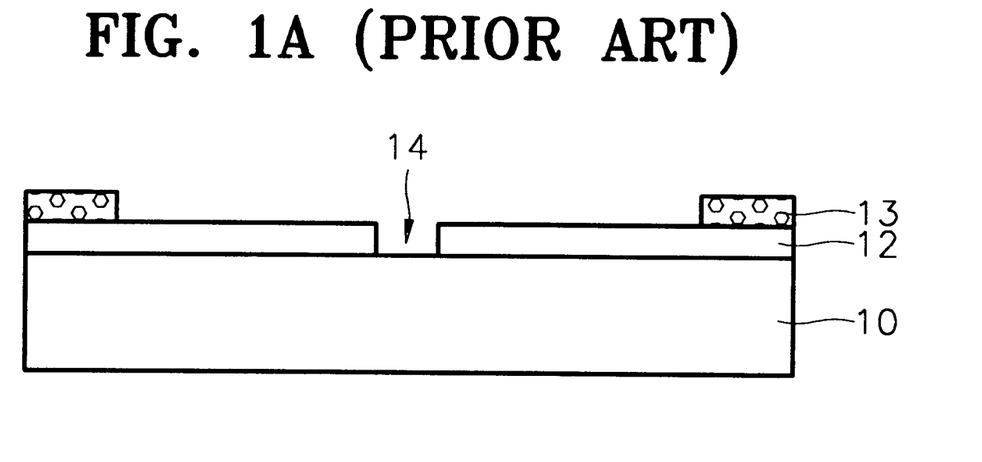
FIG. 1A is a cross-sectional view of a conventional half-tone phase shift mask.
Figure 1B:
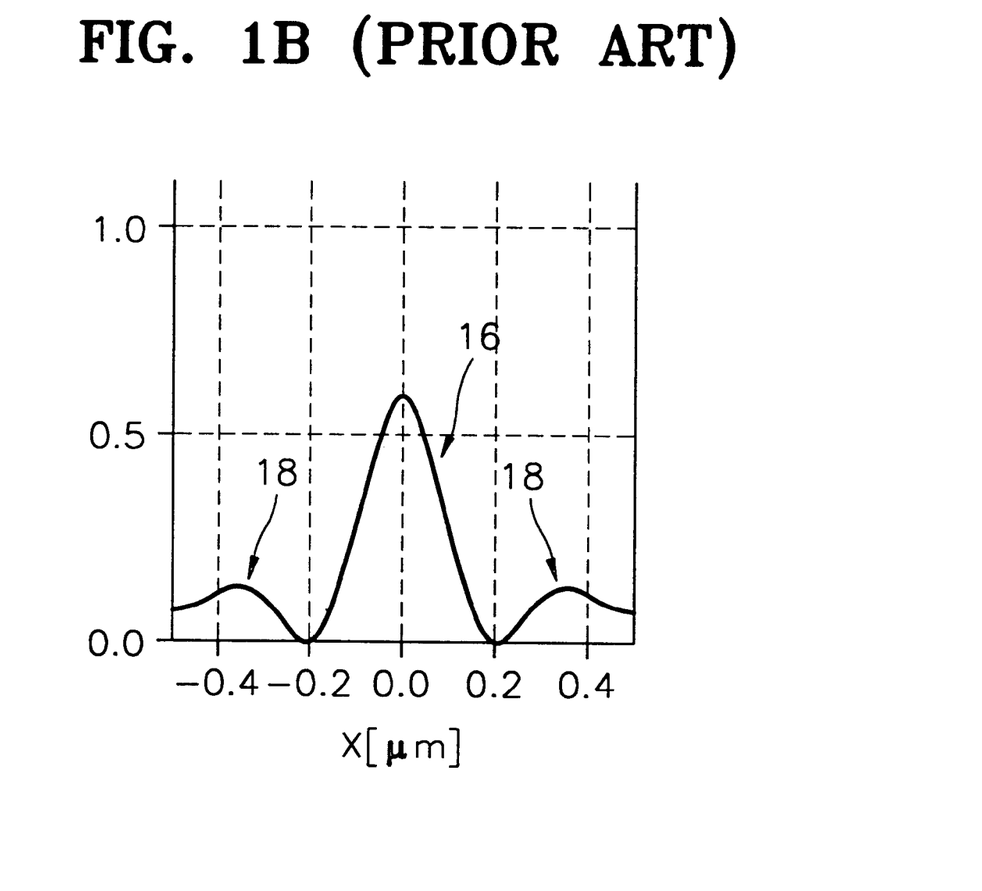
FIG. 1B is a graphic representation of a single contact pattern formed using the conventional half-tone phase shift mask.

In the conventional HT PSM, as shown in FIG. 1A, a single phase shift pattern 12 is formed on a transparent glass substrate 10, and an opaque pattern 13 is formed on the phase shift pattern 12. The phase shift pattern 12 defines an aperture 14 that exposes a predetermined area of the transparent glass substrate 10. When light is transmitted through the region of the mask delimited by the opaque pattern 13, a phase difference of 180 degrees occurs between light which passed through the aperture 14, and light which passed through the phase shift pattern 12. The width of the aperture 14 defines the width of the photosensitive film pattern.

An image of the pattern of light, namely the diffraction pattern, formed by the HT PSM shown in FIG. 1A is represented by the graph of FIG. 1B. This graph shows a main intensity curve 16 at the center, and a side lobe 18 formed at each side of the main intensity curve 16. At the boundary between the main intensity curve 16 and each side lobe 18 there is a point of inflection where the intensity is shown to be 0. These points of inflection represent locations where destructive interference occurs, i.e., where the wave front of light which passed through the aperture 14 intersects with that of light passing through a portion of the phase shift pattern 12 and out of phase by 180° with respect to the light that passed through the aperture 14. It is this phenomena of destructive interference that makes it possible to form a fine pattern on the photosensitive film. Moreover, a fine pattern is only observed when the amplitude of the main intensity curve 16 does not dip below a certain value (representing the point where insufficient exposure of the corresponding photosensitive film portion would occur), and the amplitude of the side lobe 18 does not rise above a certain value (representing the point where unwanted exposure of the corresponding photosensitive film portion would occur).

However, the smaller the width of the aperture 14 becomes in the attempt to increase the integration density of the semiconductor integrated circuit, the more the phase shift pattern 12 provides a negative phase shift effect. That is, the degree to which light is diffracted by the aperture 14 increases as the width of the aperture 14 decreases. The greater the diffraction, the greater the amplitude of the side lobe 18 becomes. Also, the negative phase shift effect extends to the main intensity curve 16, as a decrease in its amplitude.

Accordingly, when using an HT PSM, a great dose of light must be supplied to the photosensitive film to form a satisfactory pattern thereon. Thus, using a conventional HT PSM requires a long exposure time. Also, a great dose of light spoils the profile of the photosensitive film pattern. This is a serious problem for highly-transmissive HT PSMs in which the transmissivity of the phase shift layers are enhanced.

SUMMARY OF THE INVENTION

An object of the present invention is to provide a half-tone phase shift mask (HT PSM) that can produce a pattern which, when imaged, is characterized by a main intensity curve having a large amplitude, and yet produces a maximal phase shift effect.

To achieve the above object, the half-tone phase shift mask of the present invention includes a transparent substrate, a phase shift pattern having a stepped aperture that exposes a predetermined portion of the transparent substrate having a width corresponding to the width of a pattern to be formed on photosensitive film disposed on a semiconductor substrate, and an opaque film pattern formed on the upper surface of the phase shift pattern. The stepped aperture is defined by an interior side wall of the phase shift pattern. This side wall includes a horizontal surface which is parallel to the surface defining the bottom of the aperture. Light transmitted by the mask via the surface defining the bottom of the aperture has a phase difference of 180 degrees with respect to light transmitted by the mask via the horizontal surface, and light transmitted by the mask via the surface defining the bottom of the aperture has a phase difference of more than 180 degrees with respect to light transmitted by the mask via the upper surface of the phase shift pattern.

The bottom of the aperture can extend into the transparent substrate from the upper surface thereof. In this case, the phase shift pattern can consist of a single layer. For instance, the phase shift pattern can be formed of amorphous carbon, MoSiON, SiN or spin on glass (SOG).

Alternatively, the bottom of the aperture can coincide with the upper surface of the transparent substrate. In this case, the phase shift pattern can consist of a single layer or of a first layer and a second discrete layer formed on the first layer.

When the phase shift pattern is formed of first and second layers, the first layer of the phase shift pattern defines the width of the bottom of the aperture. The second layer of the phase shift pattern delimits the horizontal surface of the stepped side wall. In one embodiment, the first layer can cause a phase variation of 180 degrees, and the second layer can cause a phase variation of more than 0 degrees in light transmitted therethrough during the exposure process. In this case, the second layer of the phase shift pattern delimits the horizontal surface of the stepped side wall at the top surface of the first layer to form the step in the aperture. In another embodiment, the step can be formed in the second layer itself. In this case, the first layer causes a phase variation of less than 180 degrees.

Still further, the first layer can be of a material having substantially the same refractive index as the transparent substrate.

BRIEF DESCRIPTION OF THE DRAWINGS

These and other objects, features and advantages of the present invention will become more apparent from the following detailed description of the preferred embodiments thereof made with reference to the attached drawings, of which.

DETAILED DESCRIPTION OF THE PREFERRED EMBODIMENTS

Figure 2A:
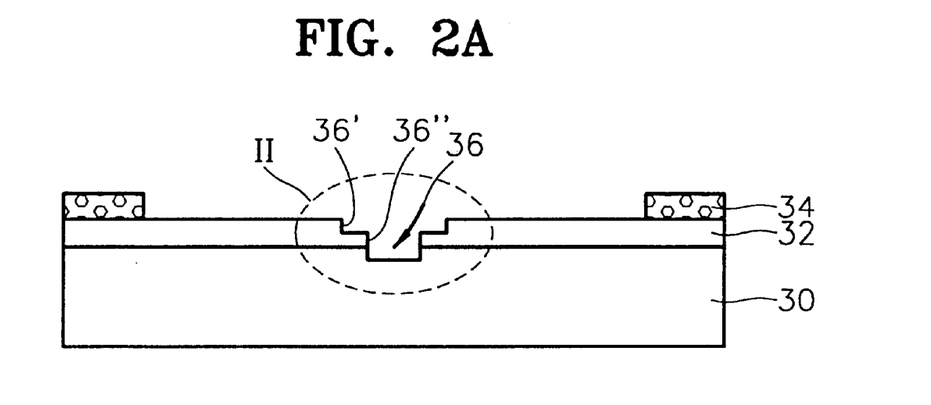
FIG. 2A is a cross-sectional view of a first embodiment of a half-tone phase shift mask according to the present invention.

Referring first to FIG. 2A, a first embodiment of a half-tone phase shift mask (HT PSM) according to the present invention includes a phase shift pattern 32 formed on a transparent substrate 30 (hereinafter, referred to merely as a substrate). The substrate 30 can be a transparent crystal quartz substrate. An opaque film pattern 34 is formed on the surface of an outer peripheral portion of the phase shift pattern 32. The phase shift pattern 32 changes the phase of light which is transmitted therethrough. The opaque film pattern 34 blocks light to prevent a region of a photosensitive film formed on a semiconductor substrate from being exposed. The phase shift pattern 32 can be an amorphous carbon film, an MoSiON film, an SiN film or a spin on glass (SOG) film. The opaque film pattern 34 can be formed of nickel, chrome, molybdenum, or an alloy of two or more materials. Alternatively, the opaque film pattern 34 can be formed of nickel oxide, chrome oxide or molybdenum oxide.

An aperture 36 having a T-shaped sectional profile is formed between diametrically opposing portions of the opaque film pattern 34. The T-shaped aperture 36 is defined by the phase shift pattern 32 and the substrate 30, and consists of an upper aperture 36' and a lower aperture 36".

Figure 2B:
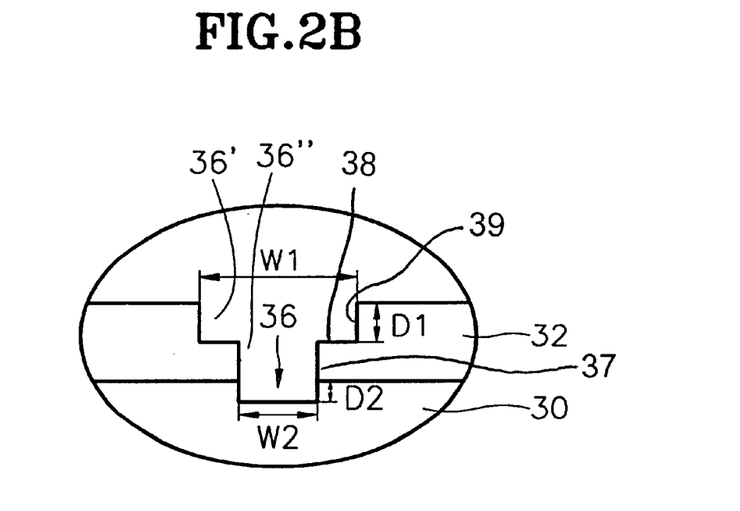
FIG. 2B is an enlargement of portion 11 of the half-tone phase shift mask of FIG. 2A.

Referring to FIG. 2B, which shows the aperture 36 in greater detail, the upper aperture 36' has a first width W1 as taken along the upper surface of the phase shift pattern 32, and a first depth D1 as taken downwardly from the upper surface of the phase shift pattern 32. The lower aperture 36" extends downwardly from the bottom of the upper aperture 36', and has a second width W2 that is less than the first width W1. The lower aperture 36" also has a depth D2 as measured downwardly from the upper surface of the substrate 30. The phase shift pattern 32 thus has a stepped side wall defining the aperture 36. The stepped side wall includes a first vertical side wall surface 37 extending upwardly away from the surface defining the bottom of the aperture 36, a horizontal side wall surface (step) 38 extending parallel to the surface defining the bottom of the aperture, and a second vertical side wall surface 39 extending upwardly from the outer periphery of the horizontal surface 38.

The operating principle behind the first embodiment of the HT PSM according to the present invention will now be described with reference to FIG. 2C in which first through fourth transmissive regions of the mask are designated. More specifically, as shown in FIG. 2C, the region at which the opaque film pattern 34 is formed is designated as the first transmissive region $T_1$; the region at which the bottom of the lower aperture 36" is formed is designated the second transmissive region $T_2$; the region at which the bottom of the upper aperture 36' is formed is designated the third transmissive region $T_3$; and the region at which the phase shift pattern extends between the T-shaped aperture 36 and the opaque film pattern 34 is designated the fourth transmissive region $T_4$.

Next, $\Delta\theta_{ij}$ (where $i \leq 4$, $j \leq 4$, but $i \neq j$) will denote the phase difference between light that has passed through an i-transmissive region and light that has passed through a j-transmissive region. Hence, $\Delta\theta_{23}$ denotes the phase difference between light that has passed through the second transmissive region $T_2$ and light that has passed through the third transmissive region $T_3$. $\Delta\theta_{24}'$ (not $\theta_{24}$) denotes the phase difference between light that has passed through the bottom of the aperture 14 and light that has passed through the upper surface of the phase shift pattern 12, in the conventional HT PSM shown in FIG. 1A.

Figure 2C:
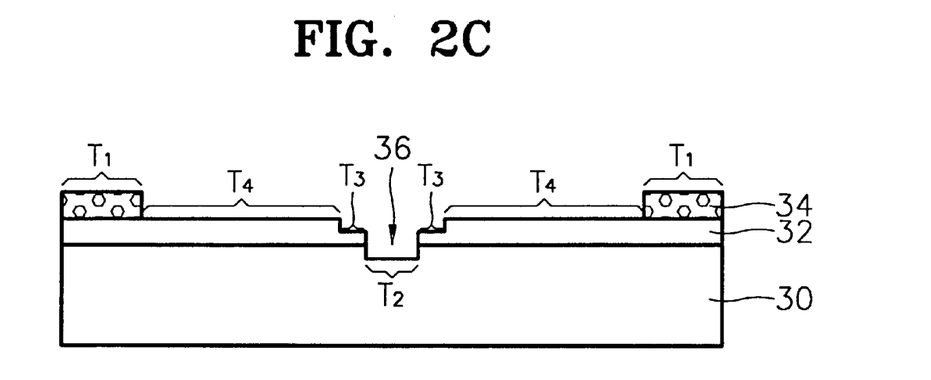
FIG. 2C is another cross-sectional view of the first embodiment of the half-tone phase shift mask according to the present invention, in which first through fourth light-transmissive regions thereof are denoted.

Still referring to FIG. 2C, the conventional HT PSM causes a single phase shift $\Delta\theta_{24}'$ of 180° and produces a light transmittance of only one value. However, in the HT PSM according to the present invention, the second transmissive region $T_2$ is recessed from the upper surface of the substrate 30 (by a depth D2 shown best in FIG. 2B). Hence, $\Delta\theta_{24}$ is more than 180 degrees.

That is, in the present invention, the portion of the substrate 30 at the second transmissive region $T_2$ is thinner than the portion of the substrate 30 at the fourth transmissive region $T_4$. More specifically, the second transmissive region $T_2$, having a finite width W2 and depth D2, consists of air having a low permittivity. Accordingly, the phase variation of light transmitted by the second transmissive region $T_2$ in the HT PSM of the present invention is less than that of light transmitted by the second (glass) transmissive region of the conventional HT PSM, while the phase variation of light transmitted by the fourth transmissive region $T_4$ of the HT PSM of the present invention is the same as that transmitted through the corresponding region in the conventional HT PSM. Thus, $\Delta\theta_{24}$ is more than 180 degrees in the present invention.

However, a phase difference $\Delta\theta_{24}$ of more than 180 degrees requires another phase shift region in order to form a point, using interference, where the main intensity becomes zero. Hence, the first embodiment of the HT PSM according to the present invention includes a discrete third transmissive region $T_3$. Also, the third transmissive region $T_3$ can have a width that is less than that of the phase shift region in the conventional HT PSM.

In the conventional HT PSM, the 180 degree phase shift effect caused by the phase shift region, i.e, the aperture 14 of the phase shift pattern 12, limits the maximum value of the main intensity curve. The HT PSM of the present invention is not subject to such limitations because the phase difference $\Delta\theta_{24}$ produced by the corresponding regions is not 180 degrees.

The third transmissive region $T_3$ is used to provide a light transmittance which is higher than that of the conventional phase shift region, to produce a phase shift effect, from a narrow region, which is greater than the phase shift effect provided by the prior art. Thus, the third transmissive region $T_3$ in the HT PSM according to the present invention comprises a recess in the phase shift pattern 32. Therefore, instead of passing through the full thickness of dielectric material, i.e., of the phase shift pattern 32, some of the light passes through the third transmissive region $T_3$ comprising a region of air having a low permittivity.

The second depth D2 of the second transmissive region $T_2$ and the first depth D1 of the third transmissive region $T_3$ have an inseparable relation in connection with the technical spirit of the present invention. The inseparable relation will now be described in detail with reference to Equations 1 and 2:

$$\Delta\theta_{2j} = 2\pi(n-1)d/\lambda \text{ [radians]} \quad (1)$$

$$T = \exp(-4\pi k d/\lambda) \quad (2)$$

wherein n denotes the refractive index of the material of a phase shift pattern, $\lambda$ denotes the wavelength of the light used for the exposure process, d denotes the thickness of the material of a phase shift film, k denotes an attenuation constant, T denotes a light transmittance, and $\Delta\theta_{2j}$ denotes the phase difference between light which has been transmitted by the second transmissive region and light which has been transmitted by the j-th transmissive region.

The way in which the first depth D1 of the third transmissive region $T_3$ and the second depth D2 of the second transmissive region $T_2$ are determined in relation to each other, using Equations 1 and 2, will now be described with respect to an example of an HT PSM according to the present invention. In this example, the phase shift pattern 32 on the substrate 30 is formed of MoSiON, the substrate is formed of crystal quartz, the refractive index (n) of the MoSiON is 2.24 and the attenuation constant (k) thereof is 0.5337, the substrate has a refractive index of 1.5; and the wavelength of the light used in the exposure process is 248 nm.

The light transmittance of the third transmissive region $T_3$ is to be 20%. Accordingly, the thickness of that portion of the MoSiON phase shift pattern 32 below the third transmissive region $T_3$ is calculated by substituting the light transmittance (0.2) of the third transmissive region $T_3$, the wavelength (248 nm) of the exposure source and the attenuation constant (0.5337) of the MoSiON phase shift pattern 32 into Equation 2. As a result, that portion of the phase shift pattern 32 below the third transmissive region $T_3$ should have a thickness of 600 Å. Then, the first depth D1 is obtained by subtracting 600 Å from the thickness of the phase shift pattern 32, 1000 Å. Thus, the first depth D1 is 400 Å. Also, $\Delta\theta_{23}$ is calculated by substituting the thickness (600 Å) of that portion of the phase shift pattern below the third transmissive region $T_3$ and other factors into Equation 1. As a result, $\Delta\theta_{23}$ is 0.6 $\pi$ radians (108°). The phase difference $\Delta\theta_{23}$ of 0.67 $\pi$ radians (108°) refers to the case when the second transmissive region $T_2$ is not recessed into the substrate 30. Thus, if the second transmissive region $T_2$ were not recessed by the second depth D2 into the substrate 30, the third transmissive region $T_3$ would not cause the required phase shift effect. Thus, a phase difference $\Delta\theta_{23}$ of 180 degrees can only be produced by extending the second transmissive region $T_2$ into the substrate 30. Equation 1 is used to calculate the second depth D2 by which the substrate 32 at the second transmissive region $T_2$ should recessed. The second depth D2 is calculated by using 0.4 $\pi$ radians (72°) for the phase difference $\Delta\theta$, to obtain a phase difference of $\pi$, since $\Delta\theta_{23}$ is 0.6 $\pi$ radians (108°), and by substituting the refractive index of the substrate and the wavelength of the exposure light into Equation 1. As a result, the second depth D2 is 990Å.

The above description of the relationship between the first and second depths D1 and D2 and the course of determining the two depths refers to the case when the phase shift pattern 32 is formed of MoSiON. However, the first and second depths D1 and D2 can be determined in the same way regardless of the material the phase shift pattern.

An aerial image of the pattern formed by using the first embodiment of the HT PSM according to the present invention will now be compared to that formed by using the conventional HT PSM. The aerial images were obtained using the HT PSM of the present invention and the conventional HT PSM under the same conditions. Under these conditions, single contact patterns each having a width of 200 nm were formed on wafers, respectively.

Figure 3A:
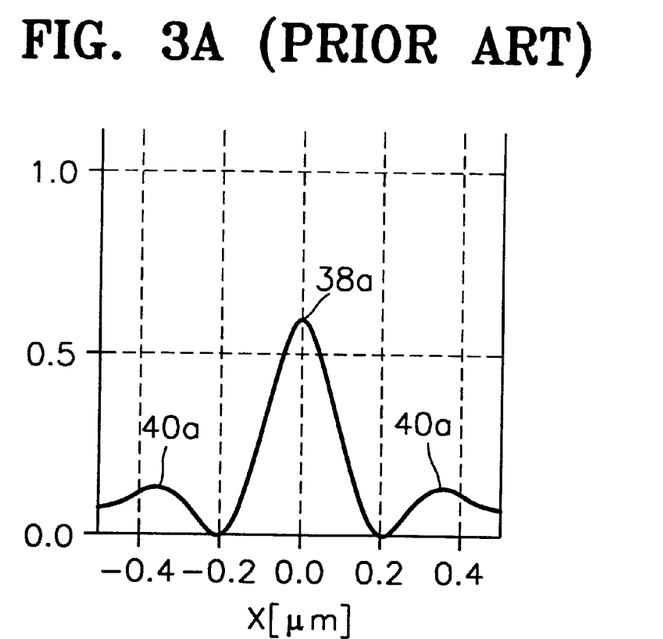
FIG. 3A is a graphic representation of a single contact pattern formed by using the conventional half-tone phase shift mask.

FIG. 3A is a graphic representation of the aerial image of the diffraction pattern formed using a conventional HT PSM.

Figure 3B:
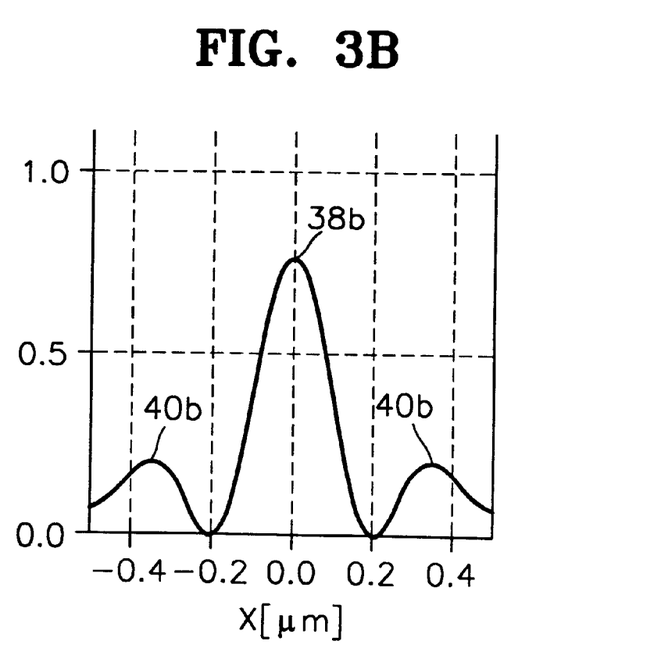
FIG. 3B is a graphic representation of a single contact pattern formed by using the first embodiment of the half-tone phase shift mask according to the present invention.

The conventional HT PSM comprises an MoSiON phase shift pattern having a thickness of 1000 Å and a 6.7% light transmittance, a first transmissive region $T_1$, a second transmissive region $T_2$, and a fourth transmissive region $T_4$. FIG. 3B is a graphic representation of the aerial image of the diffraction pattern formed using the HT PSM according to the present invention. This HT PSM comprises an MoSiON phase shift pattern having a thickness of 1000 Å and a 6.7% light transmittance, a first transmissive region $T_1$, second and third transmissive regions $T_2$ and $T_3$ having a second depth of 990 Å and a first depth of 400 Å, respectively, and a fourth transmissive region $T_4$. In each of FIGS. 3A and 3B, the distance in the lateral direction of the diffraction pattern formed on the flat surface of the wafer is plotted along the X axis, and the intensity of normalized light is plotted along the vertical axis.

As can be seen in the graphs of FIGS. 3A and 3B, side lobes 40a and 40b are formed on either side of main intensity curves 38a and 38b, respectively. It becomes evident that the amplitude of the main intensity curve 38a when the conventional HT PSM is used is less than that of the main intensity curve 38b when the HT PSM according to the present invention is used. Likewise, it becomes evident that the amplitudes of the side lobes 40a when the conventional HT PSM is used are less than those of the side lobes 40b when the HT PSM according to the present invention is used. However, the negative effects shown by the increase in the amplitude of the side lobes can be overcome by controlling the dose of light in the exposure process.

Hereinafter, using a simulation, the performance of the HT PSM according to the present invention (experimental group) will be compared in more detail to that of the conventional HT PSM (control group). The control group includes HT PSMs (hereinafter, referred to as control group 1) producing a phase shift difference $\Delta\theta_{24}'$ of 180 degrees and comprising a phase shift pattern 12 (FIG. 1A) having a light transmittance of 6.7%, and highly-transmissive HT PSMs (hereinafter, referred to as control group 2) also producing a phase shift difference $\Delta\theta_{24}'$ of 180 degrees but comprising a phase shift pattern 12 having a light transmittance of 15%. The experimental group consists of HT PSMs according to the present invention in which the third and fourth transmissive regions have a light transmittance of 20% and a light transmittance of 6.7%, respectively, $\Delta\theta_{23}$ is 180 degrees, and $\Delta\theta_{24}$ is 1.4 π radians (252°). The simulation was performed with respect to the forming of a contact hole pattern having a critical dimension (CD) of 200 nm. The "threshold" refers to the dose of light necessary to form the contact hole pattern. The larger the threshold, the less exposure time is required. Also, a "log inclination" is a value representing the slope of the main intensity curve when the threshold is reached. The log inclination is an indicator of how well a contact pattern is formed. The greater the log inclination, the better the pattern is formed.

Figure 3C:
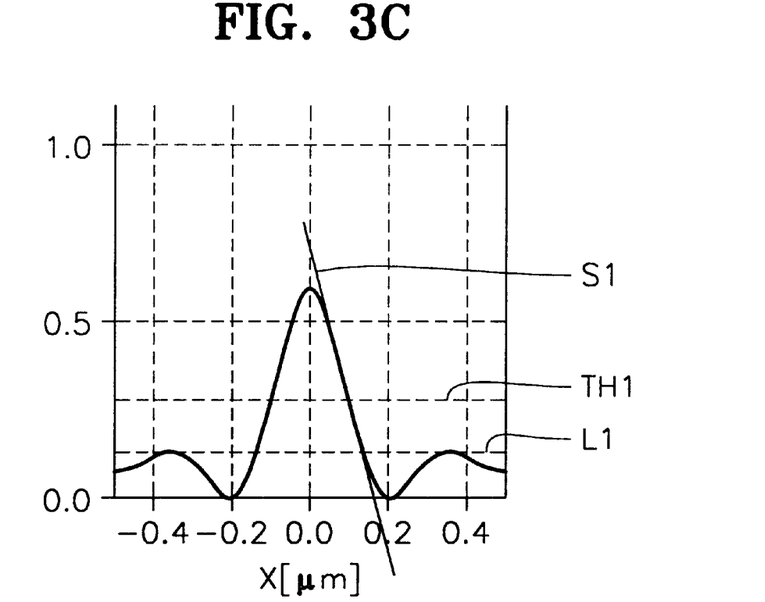
FIGS. 3C through 3E are graphs of the results of simulations designed to compare the conventional half-tone phase shift mask to that of the present invention.
Figure 3D:
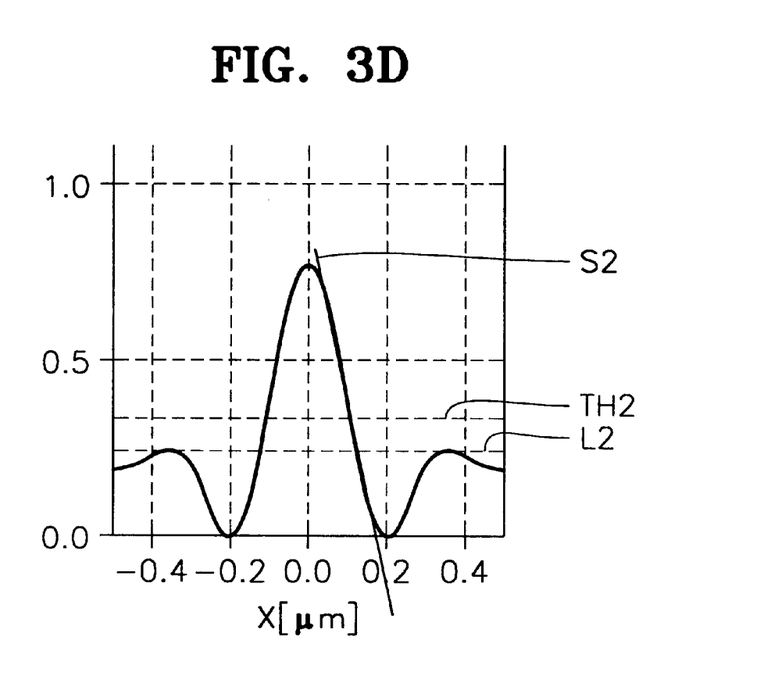

In the control group 1, as shown in FIG. 3C, the threshold (TH1) is 0.29, the log inclination (S1) is 16.51, and the amplitude (L1) of a side lobe is 0.13. In the control group 2, as shown in FIG. 3D, the threshold (TH2) is 0.344, the log inclination (S2) is 17.76, and the amplitude (L2) of a side lobe is 0.25. In the experimental group, as shown in FIG. 3E, the threshold (TH3) is 0.331, the log inclination (S3) is 17.81, and the amplitude (L3) of a side lobe is 0.17.

Figure 3E:
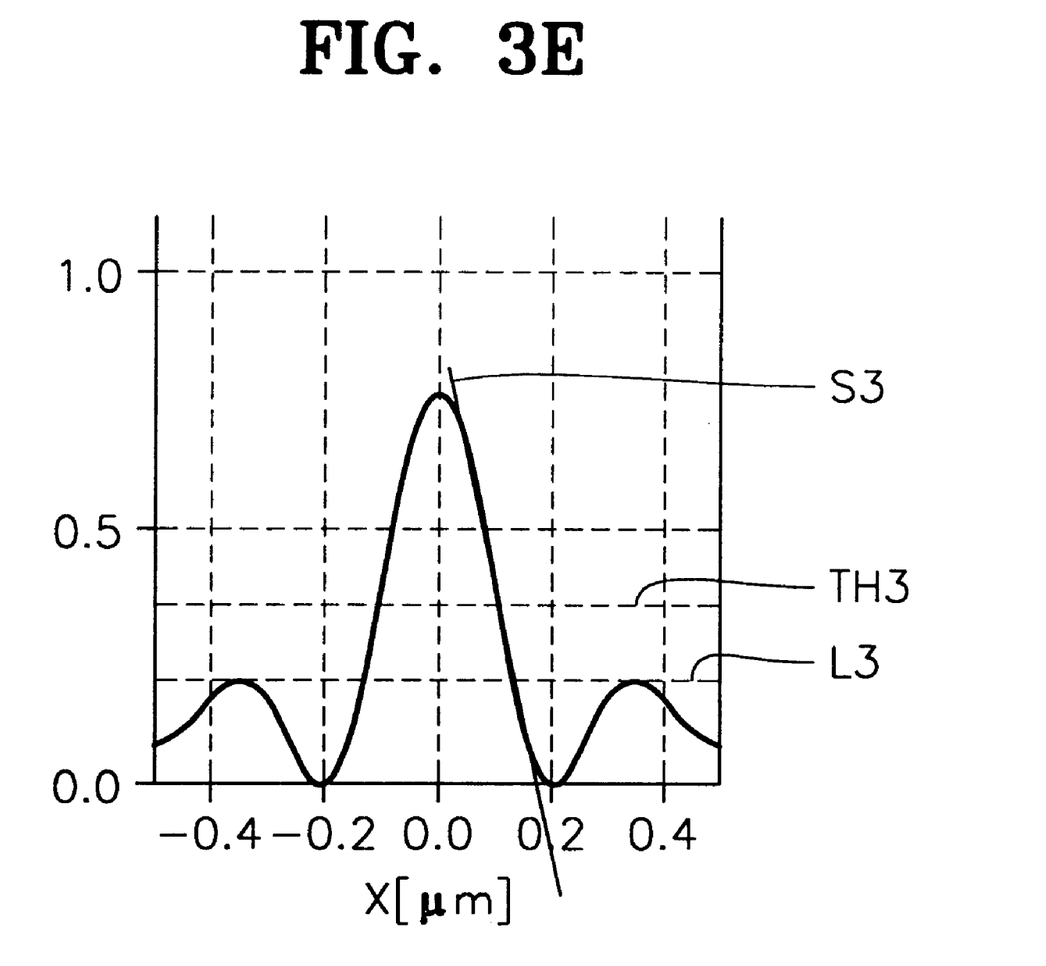

The results of the simulation performed with respect to the control groups and the experimental group, and shown in FIGS. 3C through 3E, are tabulated below for ease of understanding.

TABLE 1

| | threshold | log inclination | maximum value of side lobe |
|---|---|---|---|
| control group 1 | 0.28 | 16.51 | 0.13 |
| control group 2 | 0.344 | 17.76 | 0.25 |
| experimental group | 0.331 | 17.81 | 0.17 |

Comparing the threshold value of the experimental group with those of the control groups, it becomes evident that a contact pattern can be formed using the experimental group with a light dose of about 23% of that required to form the same pattern using the control group 1. This indicates that using the HT PSMs of the experimental group requires an exposure time of about 23% of that required when using the HT PSMs of control group 1.

Moreover, the experimental group yields the largest log inclination value. Thus, the HT PSMs of the experimental group can form better contact patterns than the HT PSMs of the control groups.

Finally, as mentioned before, one of the problems in conventional HT PSMs is that they can unintentionally and undesirably expose a region of a photosensitive film, this region corresponding to the side lobe. With this in mind, note the difference between the threshold value and the amplitude of the side lobe. The experimental group has a difference therebetween of 0.161, the control group 1 has a difference of 0.15, and the control group 2 has a difference of 0.094. These values represent the doses of light which are required for exposing the region corresponding to the side lobe. Thus, it is evident that the HT PSMs of the experimental group require the greatest dose of light to actually expose the region corresponding to a side lobe. Therefore, the HT PSMs of the experimental group provide the greatest margin for the dose of light that can be used in carrying out a satisfactory exposure process.

The technical spirit of the present invention, as described above, is also realized by the second through fourth embodiments of the HT PSMs described below.

Figure 4:
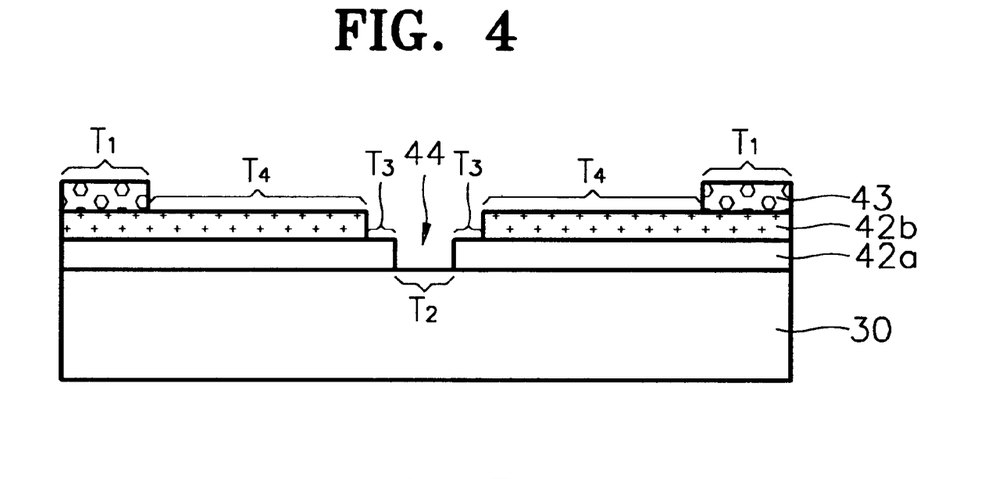
FIG. 4 is a cross-sectional view of a second embodiment of a half-tone phase shift mask according to the present invention.

The second embodiment of the HT PSM according to the present invention, as shown in FIG. 4, has first and second phase shift patterns 42a and 42b on a substrate 30. An opaque film pattern 43 is formed on the second phase shift pattern 42b. The materials of the first and second phase shift patterns 42a and 42b and the opaque film pattern 43 are substantially the same as those of the first embodiment.

The second embodiment of the HT PSM includes first through fourth transmissive regions $T_1$ through $T_4$ and a T-shaped aperture 44, as in the first embodiment. However, unlike the first embodiment, the second transmissive region $T_2$ does not extend into the substrate 30. Moreover, the third transmissive region $T_3$ is defined on the upper surface of the first phase shift pattern 42a, and the fourth transmissive region $T_4$ is defined in the second phase shift pattern 42b.

In the second embodiment of the HT PSM according to the present invention, $\Delta\theta_{23}$ is preferably 180 degrees and $\Delta\theta_{24}$ is more than 180 degrees, as in the first embodiment. That is, the first phase shift pattern 42a is formed so that $\Delta\theta_{23}$ is 180 degrees. Also, the third transmissive region $T_3$ defined on the first phase shift pattern 42a preferably has a light transmittance of more than 15%. The second phase shift pattern 42b is provided in consideration of only the light transmittance, since the first phase shift pattern 42a producing a phase difference $\Delta\theta_{23}$ of 180 degrees causes the phase difference $\Delta\theta_{24}$ to be more than 180 degrees only if the second phase shift pattern 42b is provided on the first phase shift pattern 42a. However, the second phase shift pattern 42b is provided so that $\Delta\theta_{24}$ is preferably more than 1.2 π radians (216°), in order to maximize the performance of the HT PSM. Also, the second phase shift pattern 42b preferably has a light transmittance of more than 50%. Considering the light transmittances of the first and second phase shift patterns 42a and 42b, the light transmittance of the fourth transmissive region $T_4$ becomes more than 7.5%.

Figure 5:
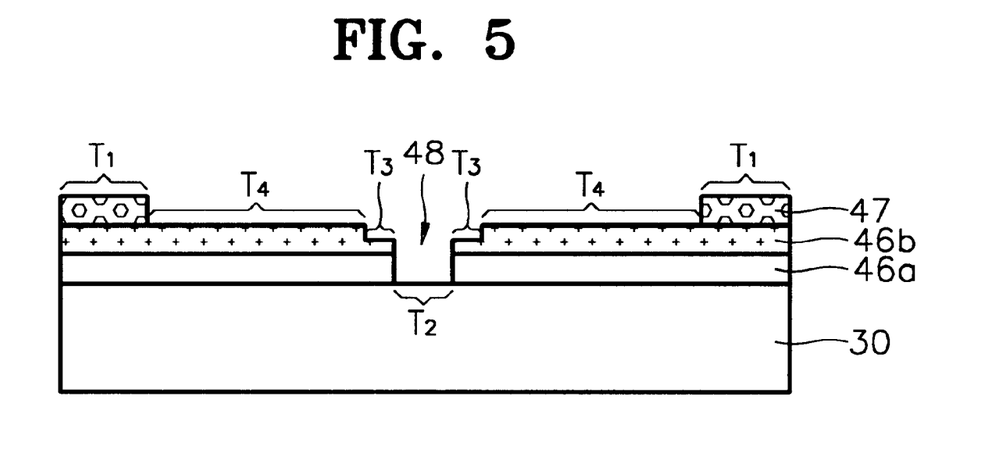
FIG. 5 is a cross-sectional view of a third embodiment of a half-tone phase shift mask according to the present invention.

In the HT PSM according to the third embodiment of the present invention, as shown in FIG. 5, a spin on glass (SOG) pattern 46a is formed on the substrate 30. The SOG pattern 46a has almost the same refractive index as that of the substrate 30. The thickness of the SOG pattern 46a corresponds to the second depth D2 in the first embodiment of the present invention. That is, unlike the first embodiment in which the second transmissive region $T_2$ comprises a recess in the substrate 30, the third embodiment uses the SOG film to form the second transmissive region $T_2$. Hence, when the refractive index of the SOG pattern 46a is the same as that of the substrate 30, the thickness of the SOG pattern 46a is the same as the second depth D2 in the embodiment of FIG. 2B. Also, in this case, a phase shift pattern 46b corresponds to the phase shift pattern 32 of the first embodiment of the present invention.

Figure 6:
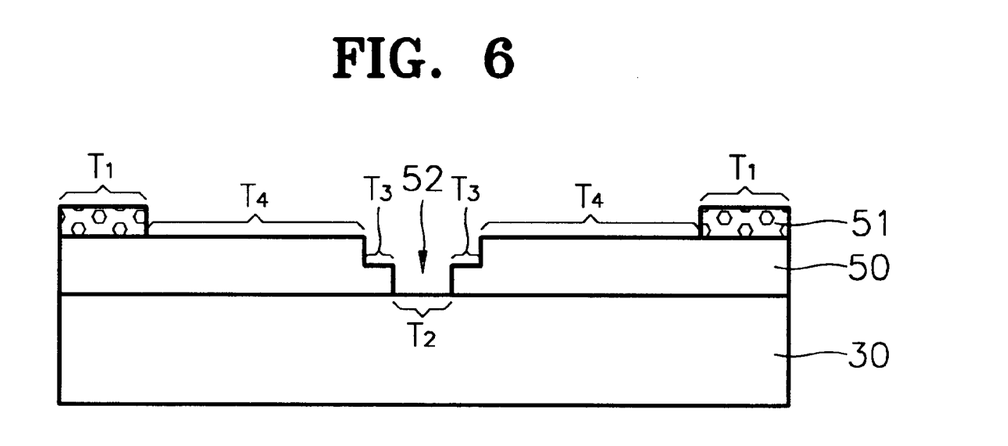
FIG. 6 is a cross-sectional view of a fourth embodiment of a half-tone phase shift mask according to the present invention.

In the fourth embodiment of the present invention, as shown in FIG. 6, a phase shift pattern 50 consisting of a single film is formed on the substrate 30. As in the first embodiment of the present invention, the fourth embodiment of the HT PSM has first through fourth transmissive regions $T_1$ through $T_4$, an opaque film pattern 51 and a T-shaped aperture 52.

However, the second transmissive region $T_2$ does not extend into the substrate 30. Moreover, the second and third transmissive regions $T_2$ and $T_3$ comprise respective recesses in the single film of the phase shift pattern 50. Similar to the first embodiment of the present invention, the fourth embodiment produces a phase difference $\Delta\theta_{23}$ of 180 degrees and a phase difference $\Delta\theta_{24}$ of more than 180 degrees. The third transmissive region $T_3$ has a light transmittance of more than 20%. Preferably, the light transmittance of the phase shift pattern 50 is 6.7%, and the phase difference $\Delta\theta_{24}$ is more than 1.2π.

Methods of fabricating the HT PSMs of the present invention will now be described in detail with reference to FIGS. 7–19.

Figure 7:
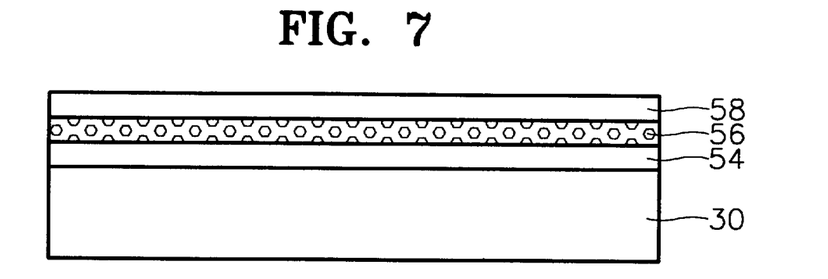
FIGS. 7 through 13 are cross-sectional views of a mask substrate, illustrating a process for fabricating the first embodiment of the half-tone phase shift mask according to the present invention.

In order to fabricate the first embodiment of the HT PSM according to the present invention, first, a phase shift film 54 is formed on the substrate 30, as shown in FIG. 7. The phase shift film 54 is formed to a predetermined thickness which can cause a phase change of 180 degrees when light is transmitted by the phase shift film 54. Then, an opaque (to the exposure light) film 56 is formed on the phase shift film 54. Thereafter, an electron beam resist film or a photoresist film 58 (hereinafter, referred to as a resist) is formed on the opaque film 56. When the resist 58 is formed, a blank mask used to fabricate the HT PSM is prepared.

Figure 8:
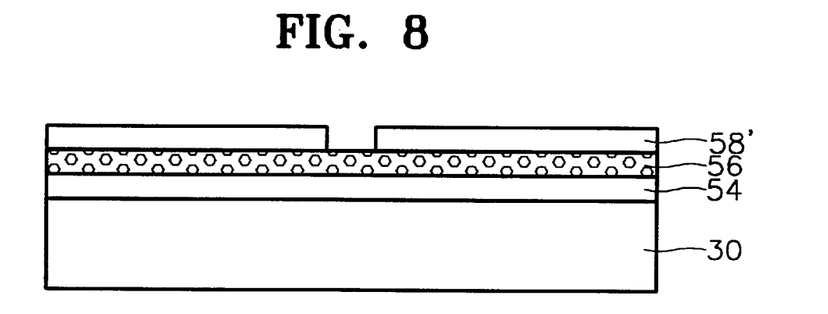

Referring to FIG. 8, a resist pattern 58' defining the second transmissive region $T_2$ (see FIG. 2C) is formed by patterning the resist 58. The width of the resist pattern 58' defines the width of the second transmissive region $T_2$ to be formed.

Figure 9:
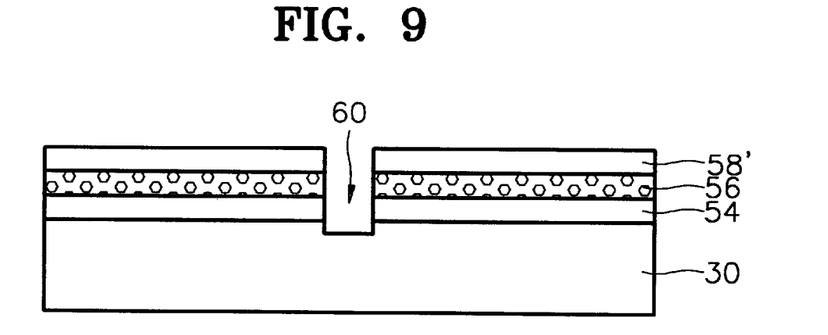

Referring to FIG. 9, parts of the opaque film 56, the phase shift film 54 and the substrate 30 are sequentially etched using the resist pattern 58' as an etch mask, thereby forming an aperture 60. The etching is stopped at the point where the aperture 60 extends into the substrate 30 by the second depth D2. Again, this second depth is determined using Equations 1 and 2, as has been described in connection with the first embodiment of an HT PSM according to the present invention.

Figure 10:
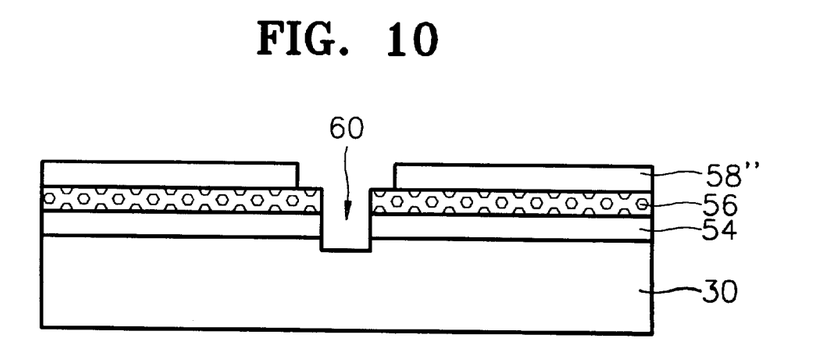

Referring to FIG. 10, after the aperture 60 is formed, the resist pattern 58' is removed. Then, a resist pattern 58", which has an aperture wider than the aperture 60, is formed on the opaque film 56 for the purpose of forming the third transmissive region $T_3$.

Figure 11:
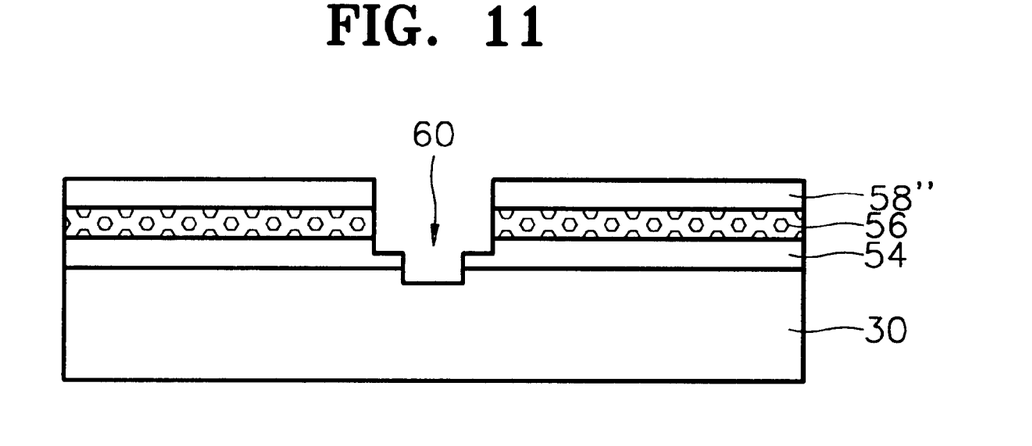

Referring to FIG. 11, the opaque film 56 and the phase shift film 54 are etched using the resist pattern 58" as an etch mask, thereby forming a stepped aperture 60. The step defines the third transmissive region $T_3$. The course of determining the first depth D1 by which the recess defining the third transmissive region extends into the phase shift film 54 has been explained in connection with the description of the first embodiment of the HT PSM. Preferably, the aperture 60 is not extended further into the substrate 30 when the step is formed in the side wall of the phase shift film 54. Thus, an etchant gas having a very low etch selectivity with respect to the substrate 30 is preferably used to etch the phase shift film 54.

Figure 12:
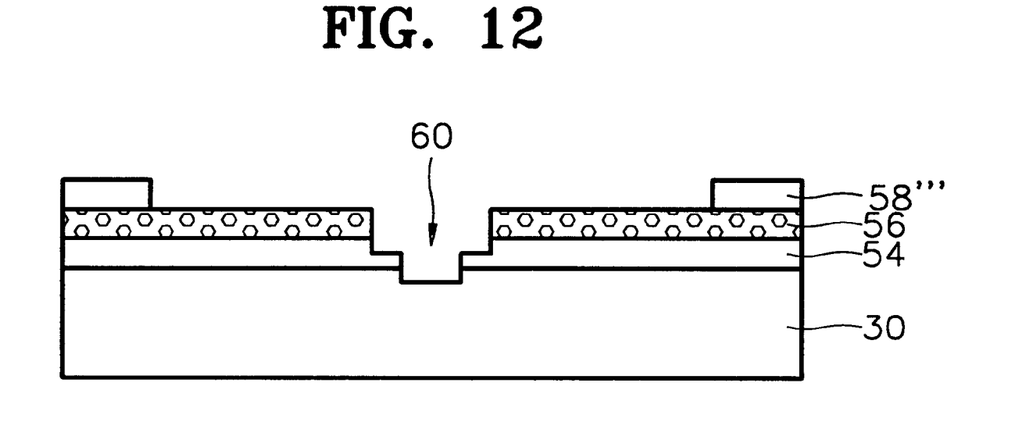

Referring to FIG. 12, the resist pattern 58" is then removed. Then, a new resist pattern 58''' is formed on the opaque film 56 for the purpose of forming the fourth transmissive region $T_4$.

Figure 13:
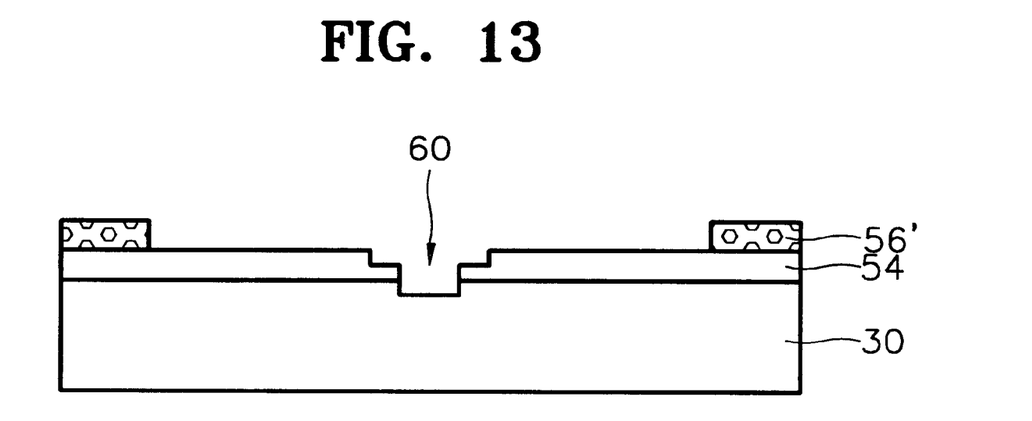

Referring to FIG. 13, the opaque film 56 is etched using the resist pattern 58''' of FIG. 12 as an etch mask, thereby forming an opaque film pattern 56'. The formation of the opaque film pattern 56' defines the first and fourth transmissive regions $T_1$ and $T_4$.

Figure 14:
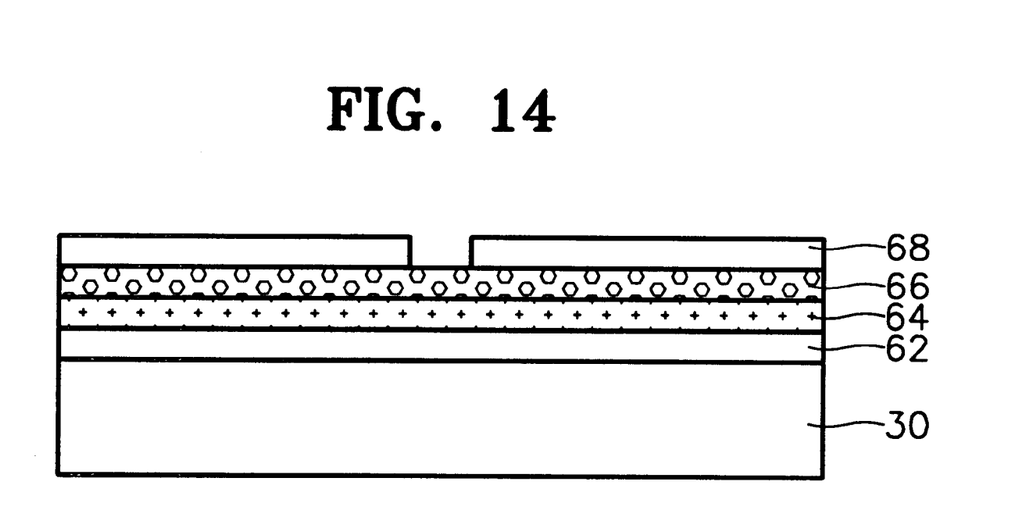
FIGS. 14 and 15 are cross-sectional views of a mask substrate, illustrating a process for fabricating the second embodiment of the half-tone phase shift mask according to the present invention.

In order to fabricate the second embodiment of the HT PSM according to the present invention, first and second phase shift films 62 and 64 and an opaque film 66 are sequentially formed on a substrate 30, as shown in FIG. 14. Then, a resist pattern 68 is formed on the opaque film 66. The width of the resist pattern 68 defines the width of the second transmissive region $T_2$. The first phase shift film 62 is formed so as to produce a phase difference $\Delta\theta_{23}$ of 180 degrees and so as to have a light transmittance of more than 20%. The second phase shift film 64 is formed so as to produce a phase difference $\Delta\theta_{24}$ of more than 1.2 π radians (216°) and so as to have a light transmittance of 45 to 50%.

Figure 15:
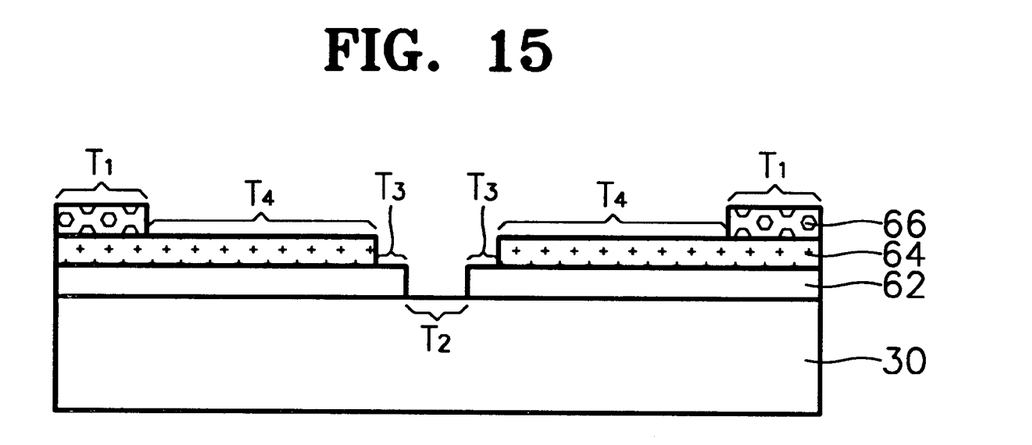

Referring to FIG. 15, the opaque film 66 and the second and first phase shift films 64 and 62 are sequentially etched using the resist pattern 68 as an etch mask, to form the second transmissive region $T_2$. Then, the third transmissive region $T_3$ is formed on the upper surface of the first phase shift pattern 62 by photolithography. Subsequently, the fourth transmissive region $T_4$ is formed on the upper surface of the second phase shift pattern 64 by photolithography. Thereafter, the first transmissive region $T_1$ is formed on the upper surface of the light-proof film pattern 68 by photolithography.

Figure 16:
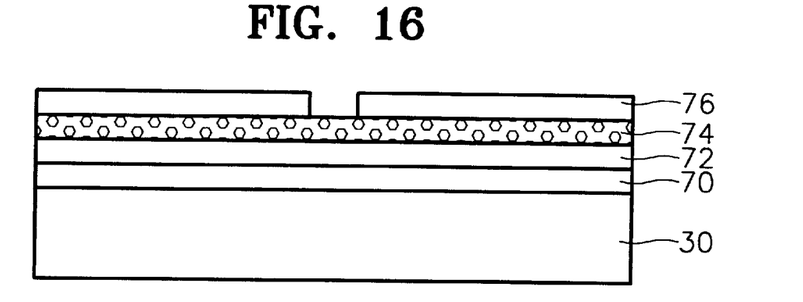
FIGS. 16 and 17 are cross-sectional views of a mask substrate, illustrating a process for fabricating the half-tone phase shift mask according to the present invention.

In order to fabricate the third embodiment of the HT PSM according to the present invention, first, an SOG film 70 having the same refractive index as the substrate 30 is formed on the substrate 30. The SOG film 70 will have a thickness corresponding to the second depth D2 in the first embodiment of the present invention. Then, a phase shift film 72 is formed on the SOG film 70. Subsequently, an opaque film 74 is formed on the phase shift film 72, and then a resist pattern 76 for defining the second transmissive region $T_2$ is formed on the opaque film 74. The phase shift film 72 is formed so as to produce a phase difference $\Delta\theta_{24}$ of 180 degrees when the third embodiment of the present invention is used.

Figure 17:
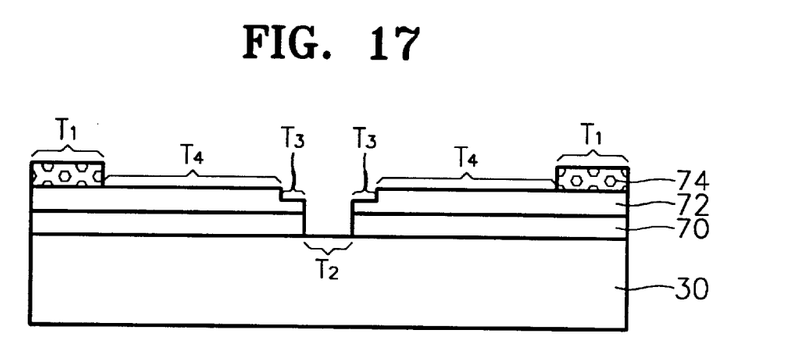

Referring to FIG. 17, the opaque film 74, the first phase shift film 72 and the SOG film 70 are sequentially etched using the resist pattern 76 as an etch mask, to form the second transmissive region $T_2$. Then, the third transmissive region $T_3$, which extends by the first depth D1 into the phase shift film 72, is formed by photolithography. Next, the fourth transmissive region $T_4$ is formed by photolithography. Subsequently, the first transmissive region $T_1$ is formed on the upper portion of the opaque film pattern 74 by photolithography.

Figure 18:
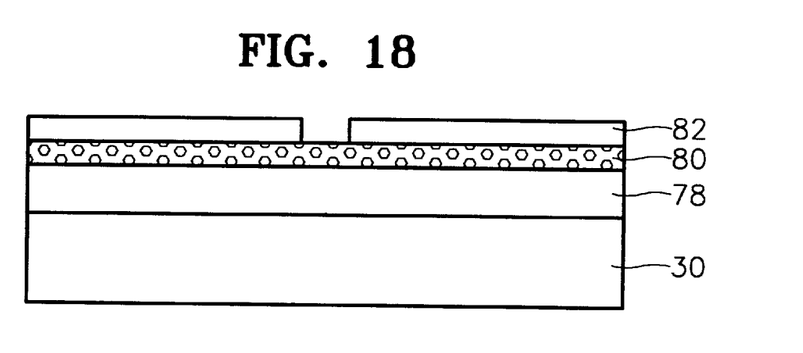
FIGS. 18 and 19 are cross-sectional views of a mask substrate, illustrating a process for fabricating the fourth embodiment of the half-tone phase shift mask according to the present invention.

In order to fabricate the fourth embodiment of the HT PSM according to the present invention, first, a phase shift film 78 is formed on the substrate 30, and then an opaque film 80 is formed on the phase shift film 78, as shown in FIG. 18. The phase shift film 78 is formed so as to produce a phase difference $\Delta\theta_{24}$ of more than 180 degrees when the HT PSM is in use. Preferably, the phase shift film 78 is designed to produce a phase difference $\Delta\theta_{24}$ of more than 1.2 $\pi$. Then, a resist pattern 82 for defining the second transmissive region $T_2$ is formed on the phase shift film 78.

Figure 19:
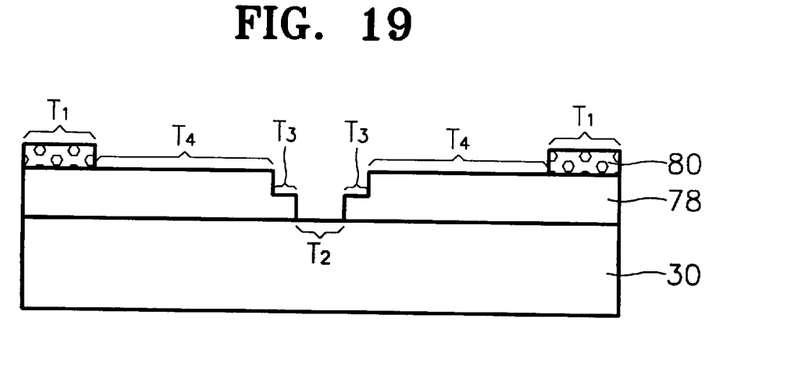

Referring to FIG. 19, the opaque film 80 and the phase shift film 78 are sequentially etched using the resist pattern 82 as an etch mask, to form the second transmissive region $T_2$. Then, the third transmissive region $T_3$ is formed by photolithography so as to produce a phase difference $\Delta\theta_{23}$ of 180 degrees when the fourth embodiment of the HT PSM is in use. Next, the fourth transmissive region $T_4$ is formed by photolithography. Finally, the first transmissive region $T_1$ is formed on the upper surface of the patterned opaque film 80 by photolithography.

It can be seen from the detailed description above that the HT PSM according to the present invention can produce a satisfactory pattern on the photosensitive film used to fabricate semiconductor devices in less time than the conventional HT PSM. Also, the HT PSM according to the present invention allows flexibility insofar as the light dose which can be used to produce the pattern is concerned. Finally, because the photosensitive film pattern can be formed in a relatively short amount of exposure time using the HT PSM of the present invention, the present invention can serve to prevent the film from deteriorating during an exposure process.

Although the invention has been described with reference to the preferred embodiments thereof, it will be apparent to one of ordinary skill in the art that to the described embodiments may be modified without departing from the true spirit and scope of the invention as defined by the appended claims.

What is claimed is:

1. A half-tone phase shift mask for use in forming a pattern on a photosensitive layer disposed on a semiconductor substrate, said mask comprising:

a transparent substrate;

a light-transmitting phase shift pattern disposed on said substrate, said phase shift pattern defining an aperture through which a predetermined portion of the top of said transparent substrate is exposed, said predetermined portion having a width corresponding to the width of a pattern to be formed on the photosensitive layer using the mask, said phase shift pattern having an upper surface, and a stepped side wall defining said aperture wherein said aperture has a T-shaped sectional profile, the stepped side wall including a first vertical side wall surface extending upwardly from a first surface defining the bottom of said aperture, a horizontal side wall surface extending parallel to said surface defining the bottom of said aperture, and a second vertical side wall surface extending upwardly from the outer periphery of said horizontal surface, and wherein said mask transmits exposure light of a predetermined wavelength via the surface defining the bottom of said aperture that is out of phase by 180 degrees with respect to the exposure light transmitted via said horizontal side wall surface, and said mask transmits the exposure light via said surface defining the bottom of the aperture that is out of phase by more than 180 degrees with respect to the exposure light transmitted via the upper surface of said phase shift pattern; and a film pattern, opaque to the exposure light, disposed on the upper surface of said phase shift pattern.

2. The half-tone phase shift mask of claim 1, wherein the bottom of the aperture is located beneath the upper surface of said transparent substrate, wherein a recess is formed by the aperture in said substrate.

3. The half-tone phase shift mask of claim 2, wherein said phase shift pattern changes the phase of the exposure light transmitted through the top surface thereof by 180 degrees.

4. The half-tone phase shift mask of claim 3, wherein said phase shift pattern consists of a single layer of material.

5. The half-tone phase shift mask of claim 4, wherein the phase shift pattern is formed of a material selected from the group consisting of amorphous carbon, MoSiON, SiN and spin on glass (SOG).

6. The half-tone phase shift mask of claim 1, wherein said substrate has a flat uppermost surface, and the bottom of said aperture coincides with and is defined by the uppermost surface of said transparent substrate.

7. The half-tone phase shift mask of claim 6, wherein the phase shift pattern changes the phase of the exposure light transmitted therethrough by more than 180 degrees.

8. The half tone phase shift mask of claim 7, wherein the phase shift pattern consists of two discrete layers of materials.

9. The half-tone phase shift mask of claim 8, wherein the phase shift pattern consists of a first layer that causes a phase shift of 180 degrees in the exposure light transmitted thereby, and a second layer that causes a phase shift of more than 0 degrees in the exposure light transmitted thereby, said second layer being disposed on said first layer.

10. The half-tone phase shift mask of claim 9, wherein said first layer of the phase shift pattern has an opening therethrough delimiting the bottom of said aperture, and said second layer of the phase shift pattern has an opening therethrough delimiting the horizontal surface of the stepped side wall at the upper surface of the first layer of the phase shift pattern.

11. The half-tone phase shift mask of claim 8, wherein the phase shift pattern consists of a first layer formed of a material having substantially the same refractive index as the transparent substrate and a second layer that causes a phase shift of 180 degrees in the exposure light transmitted thereby, said second layer being disposed on said first layer, and said second layer constituting said horizontal surface of the side wall.

12. The half-tone phase shift mask of claim 7, wherein said phase shift pattern consists of a single layer of material, and causes a phase shift of more than 180 degrees in light transmitted therethrough via an uppermost surface thereof.

* * * * *